United States Patent [19]

Platzer et al.

[11] Patent Number: 5,039,590
[45] Date of Patent: Aug. 13, 1991

[54] COATING POSITIVE OR NEGATIVE WORKING COLOR PROOFING SYSTEM

[75] Inventors: Stephan J. W. Platzer, Eltville, Fed. Rep. of Germany; Gabor I. Koletar, Berkeley Heights, N.J.

[73] Assignee: Hoechst Celanese Corporation, Somerville, N.J.

[21] Appl. No.: 425,373

[22] Filed: Oct. 17, 1989

Related U.S. Application Data

[63] Continuation of Ser. No. 156,355, Feb. 12, 1988, abandoned.

[51] Int. Cl.$^5$ .......................... G03C 7/00; G03C 5/34; G03F 7/08
[52] U.S. Cl. .................................... 430/143; 430/253; 430/254; 430/257; 430/293
[58] Field of Search ............... 430/143, 293, 253, 254, 430/257

[56] References Cited

U.S. PATENT DOCUMENTS 3,721,557  3/1973  Inoue ................................. 430/257
3,775,113  11/1973  Bonham et al. ................... 430/293
4,304,836  12/1981  Cheema ............................. 430/252
4,366,223  12/1982  Larson ............................... 430/143
4,396,700  8/1983  Kitajima et al. ................... 430/175
4,634,652  1/1987  Barton ............................... 430/143
4,650,738  3/1987  Platzer et al. ..................... 430/143
4,659,642  4/1987  Platzer et al. ..................... 430/143
4,719,169  1/1988  Platzer et al. ..................... 430/143

FOREIGN PATENT DOCUMENTS 0115899  8/1984  European Pat. Off. .
0179274  9/1985  European Pat. Off. .
0182031  5/1986  European Pat. Off. .
2009436A  12/1978  United Kingdom .

Primary Examiner—Charles L. Bowers, Jr.
Assistant Examiner—Patrick A. Doody
Attorney, Agent, or Firm—Richard S. Roberts

[57] ABSTRACT

This invention relates to a single positive or negative working photosensitive layer on a substrate which, upon exposure to an actinic radiation source through a screened image, can accurately reproduce said image after processing and lamination. The construction is useful as a color proofing film which can be employed to predict the image quality from a lithographic printing process.

14 Claims, No Drawings

COATING POSITIVE OR NEGATIVE WORKING COLOR PROOFING SYSTEM

This application is a continuation of application Ser. No. 07/156,355 filed Feb. 12, 1988, now abandoned.

BACKGROUND OF THE INVENTION

In the graphic arts, it is desirable to produce a color proof to assist a printer in correcting a set of photomasks which will be used in exposing printing plates. The proof should reproduce the color quality that will be obtained during the printing process. The proof must be a consistent duplicate of the desired half tone or line image, and should neither gain nor lose color. Visual examination of a color proof should reveal any defects on the photomask; the best color rendition to be expected from press printing of the material; the correct gradation of all colors and whether grays are neutral; and the need, if any, for subduing any of the colors and/or giving directions for altering the film photomask before making the printing plates.

Color proofing sheets for multi-colored printing have heretofore been made by using a printing press proof which requires taking all the steps necessary for actual multicolor printing. Such a conventional method of color proofing has been costly and time consuming. Alternate color proofing methods have therefore been developed to simulate the quality of press proofs. There are two known types of photographic color proofing methods, namely, the surprint type and the overlay type.

In the overlay type of color proofing, an independent transparent plastic support is used for producing an image of each color separation film. A number of such supports carrying colored images are then superimposed upon each other and placed on a white sheet to produce a color proof. The overlay type of color proofing method has the disadvantage that the superimposed plastic supports tend to darken the color proofing sheet, and, as a result, the impression of the color proofing sheet thus prepared becomes vastly different from copies actually obtained by a conventional printing press proof. Its primary advantage is that it is quick and can serve as a progressive proof by combining any two or more colors in register.

In the surprint type of color proofing method, a color proofing sheet is prepared by successively producing images of different colors from different color separation films onto a single receptor sheet. This is done by utilizing a single opaque support and by applying toners, photosensitive solutions or coatings of photosensitive materials of corresponding colors on the opaque support in succession. An example of this approach is described in U.S. Pat. No 3,671,236. An advantage of the surprint type of color proof is that the color saturation is not influenced by superimposed plastic supports. This method more closely resembles the actual printing and eliminates the color distortion inherent in the overlay system.

Various processes for producing copies of an image embodying photopolymerization and thermal transfer techniques are known as shown in U.S. Pat. Nos. 3,060,023; 3,060,024; 3,060,025; 3,481,736; and 3,607,264. In these processes, a photopolymerizable layer coated on a suitable support is imagewise exposed to a photographic transparency. The surface of the exposed layer is then pressed into contact with the image receptive surface of a separate element and at least one of the elements is heated to a temperature above the transfer temperature of the unexposed portions of the layer. The two elements are then separated, whereby the thermally transferable, unexposed, image areas of the composite transfer to the image receptive element. If the element is not precolored, the tacky unexposed image may now be selectively colored with a desired toner. The colored matter preferentially adheres to the clear unpolymerized material. U.S. Pat. No. 3,574,049 provides a transfer process for printing a design on a final support which comprises (a) printing a design onto a temporary support, (b) superimposing the temporary support and the final support, (c) applying heat and/or pressure to the superimposed structure formed in (b), and (d) separating the temporary support from the final support which retains the printed design. The affinity of the design for the temporary support is lower than its affinity for the final support.

In U.S. Pat. No. 3,721,557 a method of transferring colored images is claimed which provides a stripping layer coated between the photosensitive element and the support. When the photosensitive layer is exposed to actinic light and developed, the more soluble portions are selectively removed to produce a visible image. The image-carrying support is pressed against a suitable adhesive coated receptor member and, subsequently, the carrier support sheet is stripped to accomplish the transfer of the image. A fresh layer of adhesive is applied to the receptor for each subsequent transfer.

SUMMARY OF THE INVENTION

The present invention provides an improved method for forming a colored image which comprises:

A. providing a photosensitive element which consists essentially, of, in order:
i) a substrate having a release surface; and
ii) a photosensitive layer being laminated directly on said release surface, which photosensitive layer being laminated directly comprises a light sensitive, negative working, polymeric diazonium compound; or positive working quinone diazide compound; a resinous binder composition, which composition contains a major amount of a polyvinyl butyral polymer and at least one colorant, and
B. ether
i) laminating said element with heat and pressure with said photosensitive layer being laminated directly to a developer resistant receiver sheet; and removing said substrate by the application of peeling forces; and imagewise exposing said photosensitive layer to actinic radiation; and removing nonexposed areas of a negative working photosensitive layer or exposed areas of a positive working photosensitive layer with a liquid developer; or
ii) imagewise exposing said photosensitive layer to actinic radiation; and laminating said element with heat and pressure with said photosensitive layer to a developer resistant receiver sheet; and removing said substrate by the application of peeling forces; and removing nonexposed areas of a negative working photosensitive layer or exposed areas of a positive working photosensitive layer with a liquid developer; or
iii) laminating said element with heat and pressure with said photosensitive layer being laminated directly to a developer resistant receiver sheet; and imagewise exposing said photosensitive layer to actinic radiation; and removing said substrate by the application of peeling forces; and removing nonexposed areas of a negative working photosensitive layer or exposed areas of a positive working photosensitive layer with a liquid developer; or iv) imagewise exposing said photosensitive layer to actinic radiation; and removing nonexposed areas of a negative working photosensitive layer or exposed areas of a positive working photosensitive layer with a liquid developer; laminating said element with heat and pressure with said photosensitive layer being laminated directly to a developer resistant receiver sheet; and removing said substrate by the application of peel forces; and preferably C. repeating steps A and B at least once whereby another photosensitive element having at least one different colorant is laminated onto said receptor sheet over the non-removed portions of the previously laminated photosensitive layer or layers.

DETAILED DESCRIPTION OF THE PREFERRED EMBODIMENT

In carrying out the method of the invention, one employs a photographic element which broadly comprises a substrate having a release surface and a colored photosensitive layer on the release surface. Additional layers, such as adhesives and barrier layers, are not required.

In the preferred embodiment, the substrate is composed of a dimensionally and chemically stable base material which does not significantly change its size, shape or chemical properties as the result of the heating, coating, or other treatments which it must undergo. One preferred material is polyethylene terephthalate. In the usual case it has a thickness of from about 1 to about 10 mils, a more preferred thickness is from about 2-5 mils and most preferably from about 2-3 mils. Suitable films include Hostaphan 3000, available from American Hoechst Corporation; Mylar D, available from DuPont; and Melinex grades 0, 052, 442, 516 and S, available from ICI. The surface of the substrate may be smooth or may be provided with a matte texture by various methods known in the art.

Matte films include Melinex 377 and 470 from ICI. These materials have the unique property of giving the final image a desired matte finish without any extra steps. One can control the gloss of the final image by properly selecting the matte finish of the substrate. This effect works because the top layer of the final image is originally in contact with this matte surface. An additional advantage of coating on a matte surface is that subsequent transferred layers generally adhere better to a rough surface than to a smooth surface.

A similar matte finish of the final image can be obtained by embossing the shiny, top surface of the image with a matte material, such as described above. This is done by laminating together the final image and matte material under pressure and temperature. The matte material is then generally removed after lamination. The advantage of this method is that the finish of the final proof can be varied. Furthermore, the matting material can be used repeatedly.

A third method for producing a matte finish uses a heat transferable layer, such as Butvar 90, available from Monsanto, coated onto a film with a rough surface, such as Melinex 329, available from ICI. The adhesive layer is laminated to the final image under pressure and temperature. Then the film with the rough surface is peeled off. The rough surface imparts a matte finish to the final image. The advantage is that all layers appear matte and that the extra adhesive layer protects the image. U.S. Pat. Nos. 4,294,909 and 4,376,159, also suggests various methods for making a matte surface.

In either case, the substrate must have a release surface, that is, it must be capable of releasably holding the photosensitive layer thereto. This may be accomplished either by the substrate surface being inherently releasable, being rendered releasable by a suitable treatment, or being provided with a release layer over the substrate surface. Such a release layer may comprise polyvinyl alcohol.

Releasably bonded to the release surface is the photosensitive layer. The photosensitive layer broadly comprises a photosensitizer, a colorant, a binding resin, and other optional ingredients such as plasticizers, acid stabilizers, surfactants, anti-static compositions, uv absorbers and residual coating solvents.

The photosensitizer is preferably a light sensitive, polymeric diazonium salt or quinone diazide. The most preferred diazonium salt photosensitizer is the polycondensation product of 3-methoxy-4-diazo-diphenyl amine sulfate and 4,4'-bis-methoxy methyl-diphenyl ether, precipitated as mesitylene sulfonate as taught in U.S. Pat. No. 3,849,392. Other suitable photosensitizers are taught in U S. Pat. No. 4,436,804.

The most preferred quinone diazide photosensitizer is the ester of bis-(3-benzoyl-4,5,6 trihydroxy phenyl)-methane and 2-diazo-1-naphthol-5-sulfonic acid as taught in U.S. Pat. No. 4,407,926. Other suitable photosensitizers are taught in U.S. Pat. Nos. 4,266,001, 3,106,365, 3,148,983 and 3,201,239. The diazo compounds of choice are preferably soluble in organic solvents.

Suitable binding resins include polyvinyl butyral such resins include Butvar B72, B76 and B90 all available from Monsanto, and Mowitol B20H, B30H, and B30T all available from Hoechst. An important resin selection criterion is that it must be a good film former.

The colorants useful for the present invention include various classes of dyes and pigments. In the most preferred embodiment, pigments having an average particle size of about 1 micrometer or less are used.

Optional plasticizers which may be incorporated into the photosensitive layer include those of the phthalate and phosphate types. Preferred plasticizers include dibutyl phthalate and dimethyl phthalate. Polymeric plasticizers, such as Resoflex R-296 from Cambridge Industries, may also be incorporated. Acid stabilizers include phosphoric acid and p-toluene sulfonic acid.

These ingredients may be blended with such compatible solvents as ethanol, methyl cellosolve and methyl ethyl ketone, coated on the release surface, and dried. In the preferred embodiment, the photosensitive layer has a coating weight between approximately 0.1 and 20 $g/m^2$. The most preferred weight is from about 0.5 to 2.0 $g/m^2$.

In the preferred embodiment, the photosensitizer is present in the photosensitive layer in an amount of from about 5 to about 40 percent by weight; or more preferably from about 10 to about 35 percent by weight.

In the preferred embodiment, the colorant is present in the photosensitive layer in an amount of from about 10 to about 40 percent by weight; or more preferably from about 13 to about 34 percent by weight.

In the preferred embodiment, the binding resin is present in the photosensitive layer in an amount of from about 25 to about 80 parts by weight; or more preferably from about 32 to about 75 parts by weight.

In the preferred embodiment, the plasticizer, when one is used, is present in the photosensitive layer in an amount of up to about 20 parts by weight; or more preferably up to about 15 parts by weight and most preferably from about 12 to about 15 parts by weight.

In the preferred embodiment, the acid stabilizer, when one is used, is present in the photosensitive layer in an amount of up to about 20 parts by weight.

A typical formulation for the photosensitive layer nonexclusively includes:

|  | Cyan | Yellow | Magenta | Black |
| --- | --- | --- | --- | --- |
| methyl cellosolve | 27.37 | 62.16 | 56.58 | 58.35 |
| methyl ethyl ketone | 40.30 | 33.00 | 38.14 | 35.65 |
| ethanol | 27.20 | — | — | — |
| phosphoric acid (conc.) | 0.40 | — | 0.66 | 0.50 |
| p-toluene sulfonic acid | — | 0.25 | — | — |
| dibutyl phthalate | — | — | — | 0.75 |
| Butvar 72 | 1.08 | 1.62 | 1.58 | 1.125 |
| Butvar 90 | 0.60 | 0.80 | — | 1.50 |
| Above diazo From US 3,849,392 | 1.70 | 0.55 | 1.96 | 1.00 |
| phthalo blue pigment | 1.35 | — | — | — |
| yellow pigment | — | 1.62 | — | — |
| magenta pigment | — | — | 1.08 | — |
| black pigment | — | — | — | 1.125 |
| optical density | 1.2 | 0.9 | 1.4 | 1.3 |

In operation, the photosensitive element is laminated to a receptor sheet via the photosensitive layer. The receiver sheet should be resistant to any adverse effects which may be caused by the developer of choice. For example, the receiver sheet should be water resistant when aqueous developers are used. Plastic or plastic coated receiver sheets are useful for this purpose.

Useful receiver sheets include Melinex 329; 339; 994 and 3020 from ICI. Other white and non-white receiver sheets may also be used Rough textured and/or adhesion promoted surfaces are preferred for the receiver, which must be able to withstand the laminating and development processes.

Lamination may be conducted by putting the receiver sheet in contact with the photosensitive side of the colored composite and then introducing the two materials into the nip of a pair of heated laminating rollers under suitable pressure. Suitable laminating temperatures usually range from about 60° C. to about 100° C., preferably about 75° C. to about 95° C. After lamination, the substrate is peeled away, usually merely employing manual peeling forces. The photosensitive layer thus remains on the receiver sheet.

The photosensitive layer is imagewise exposed by means well known in the art either before or after lamination. Such exposure may be conducted by exposure to a uv light source through a photomask under vacuum frame conditions. Exposure may be performed with actinic light through a conventional negative flat. Exposures after lamination and removal of the substrate are preferred for emulsion-to-emulsion contact. Mercury vapor discharge lamps are preferred over metal halide lamps. Filters may be used to reduce light scattering in the material.

The photosensitive layer is developed by removing the nonimage area in a suitable developer at a temperature at which said photosensitive layer is substantially nontacky. Suitable developers include aqueous solutions comprising surfactants without organic solvents. Suitable developers non-exclusively include:

| I. | |
| --- | --- |
| water | 95.0 |
| sodium decyl sulphate | 3.0 |
| disodium phosphate | 1.5 |
| sodium metasilicate | 0.5 |
| II. | |
| water | 89.265 |
| monosodium phosphate | 0.269 |
| trisodium phosphate | 2.230 |
| sodium tetradecyl sulfate | 8.237 |

Any developer solution which satisfactorily removes the nonimage areas of the photosensitive layer after exposure while retaining the image areas may be used. The selection of developer is well within the ability of the skilled artisan.

The preferred developer of the present invention comprises an aqueous solution of an anionic surfactant. After development, the imaged photosensitive layer is dried.

The process can then be repeated whereby another photosensitive element having a different color is laminated to the same receiver sheet over the previously formed image. In the usual case, four colored layers are employed to produce a full color reproduction of a desired image. These are cyan, magenta, yellow and black.

The following nonlimiting example serves to illustrate the invention.

EXAMPLE

Four photosensitive solutions of cyan, yellow, magenta, and black are produced according to photosensitive formulations described above. The pigment is introduced as a dispersion of methyl ethyl ketone, Butvar B72, and the appropriate pigment. The solutions are coated and dried separately to the required optical density onto 3 mil Melinex 516 polyester films as the substrate. The yellow composite is then laminated at 80° C. with the photosensitive side onto either side of a 7 mil Melinex 3020 polyester receiver sheet. The substrate is peeled away after lamination, leaving the photosensitive layer on the receiver sheet. The yellow photosensitive layer is then exposed to actinic light through a photographic flat for the yellow color. The receiver sheet with the exposed yellow layer is then immersed for 60 sec in developer I above room temperature with gentle pad rubbing on the photosensitive side. The nonexposed, yellow areas are thereby washed off and the exposed areas remain during development. After this treatment, the imaged material is rinsed and then dried. The magenta composite is then laminated as before onto the imaged, yellow side of the receptor sheet. The magenta substrate is removed as before. The magenta photosensitive layer is then exposed through the magenta flat. It is then processed as with the yellow. The magenta is followed in a like manner by cyan and then by black to give a four color image which is an accurate representation of the original from which separations are prepared.

What is claimed is:

1. A method for forming a colored image which comprises:
   A. providing a photosensitive element which consists essentially of, in order:

i) a substrate having a release surface; and
ii) a photosensitive layer on said release surface, which photosensitive layer comprises a light sensitive, negative working, polymeric diazonium compound; or positive working quinone diazide compound; a resinous binder composition, which composition contains a major amount of a polyvinyl butyral polymer and at least one colorant; and B. either i) laminating said element with heat and pressure with said photosensitive layer being laminated directly to a developer resistant receiver sheet; and removing said substrate by the application of peeling forces; and imagewise exposing said photosensitive layer to actinic radiation and removing nonexposed areas of a negative working photosensitive layer or exposed areas of a positive working photosensitve layer with a liquid developer; or ii) imagewise exposing said photosensitive layer to actinic radiation; and laminating said element with heat and pressure with said photosensitive layer being laminated directly to a developer resistant receiver sheet; and removing said substrate by the application of peeling forces; and removing nonexposed areas of a negative working photosensitive layer or exposed areas of a positive working photosensitive layer with a liquid developer; or iii) laminating said element with heat and pressure with said photosensitive layer being laminated directly to a developer resistant receiver sheet; and imagewise exposing said photosensitive layer to actinic radiation; and removing said substrate by the application of peeling forces; and removing nonexposed areas of a negative working photosensitive layer or exposed areas of a positive working photosensitive layer with a liquid developer;

whereby a colored image is formed on the receiver sheet, and wherein steps A and B are repeated at least once wherein another photosensitive element having at least one different colorant is laminated onto said receiver sheet with its photosensitive layer laminated directly to the non-removed portions of the previous image.

2. The method of claim 1 wherein said substrate comprises polyethylene terepthalate.

3. The method of claim 1 wherein said substrate has a matte surface.

4. The method of claim 1 wherein said release surface on said substrate comprises polyvinyl alcohol.

5. The method of claim 1 wherein said photosensitive layer comprises the polycondensation product of 3-methoxy-4-dizao-diphenyl amine sulfate and 4,4'-bismethoxy methyl-diphenyl ether precipitated as mesitylene sulfonate.

6. The method of claim 1 wherein said photosensitive layer further comprises one or more ingredients selected form the group consisting of plasticizers, acid stabilizers, antistatic compositions, uv absorbers and surfactants.

7. The method of claim 1 wherein the coating weight of the photosensitive layer ranges form about 0.1 to about 20 g/m$^2$.

8. The method of claim 1 wherein the photosensitizer is present in the photosensitive layer in an amount of from about 5 to about 40 percent by weight.

9. The method of claim 1 wherein the pigment is present in the photosensitive layer in an amount of from about 10 to about 40 percent by weight.

10. The method of claim 1 wherein the binding resin is present in the photosensitive layer in an amount of from about 25 to about 80 percent by weight.

11. The method of claim 6 wherein the plasticizer is present in the photosensitive layer in an amount of up to about 20 percent by weight.

12. The method of claim 5 wherein the acid stabilizer is present in the photosensitive layer in an amount of up to about 20 percent by weight.

13. The method of claim 1 wherein the laminating step is conducted at a temperature of from about 60° C. to about 100° C.

14. The method of claim 1 wherein the photosensitive layer comprises the ester of bis-(3-benzoyl-4,5,6 trihydroxy phenyl)-methane and 2-diazo-1-naphthol-5-sulfonic acid.

* * * * *